United States Patent [19]

Ishimaru

[11] Patent Number: 5,518,961
[45] Date of Patent: May 21, 1996

[54] SEMICONDUCTOR INTEGRATED CIRCUIT DEVICE WITH WIRING MICROSTRUCTURE FORMED ON GATES AND METHOD OF MANUFACTURING THE SAME

[75] Inventor: Kazunari Ishimaru, Yokohama, Japan

[73] Assignee: Kabushiki Kaisha Toshiba, Tokyo, Japan

[21] Appl. No.: 318,225

[22] Filed: Oct. 5, 1994

Related U.S. Application Data

[62] Division of Ser. No. 149,619, Nov. 9, 1993, Pat. No. 5,397,910.

[30] Foreign Application Priority Data

Nov. 9, 1992 [JP] Japan ................... 4-322305

[51] Int. Cl.⁶ ............................................. H01L 21/441
[52] U.S. Cl. .......................... 437/193; 437/194; 437/195
[58] Field of Search ................................... 437/200, 195, 437/186, 240, 193–195

[56] References Cited

U.S. PATENT DOCUMENTS 5,019,527  5/1991  Ohshima et al. .................. 437/43
5,037,777  8/1991  Mele et al. ........................ 437/195
5,075,762  12/1991 Kondo et al. ...................... 357/71
5,200,358  4/1993  Bollinger et al. ................. 437/180
5,215,933  6/1993  Araki ................................. 437/43
5,270,240  12/1993 Lee .................................... 437/52
5,369,303  11/1994 Wei .................................... 257/751

FOREIGN PATENT DOCUMENTS 230124A   1/1990  Japan.
2137234A  5/1990  Japan.

*Primary Examiner*—George Fourson
*Assistant Examiner*—Richard A. Booth
*Attorney, Agent, or Firm*—Loeb & Loeb

[57] ABSTRACT

In a semiconductor device of gate self-alignment structure, at least two lamination layer portions each composed of a gate electrode, an insulating film and a conductive film are formed on a semiconductor substrate with a contact hole sandwiched therebetween. A wire is formed on the respective lamination layer portions. Further, a total thickness of the conductive film and the wire is determined to be large enough to prevent impurities implanted into the wire from being doped into the gate electrode. In formation of the gate self-alignment structure, an insulating side wall is formed on the side wall of the contact hole, to insulate the gate electrode from the wire or vice versa.

4 Claims, 10 Drawing Sheets

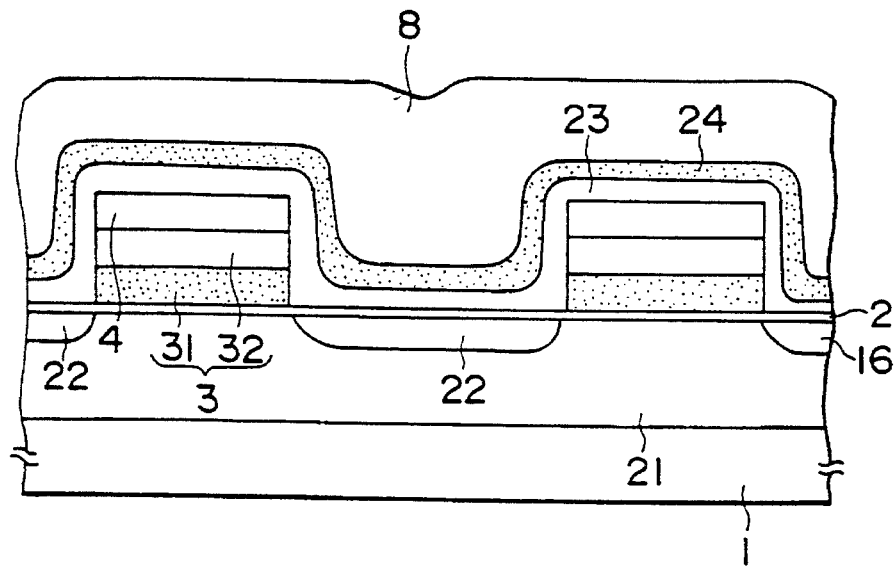
FIG. IA PRIOR ART
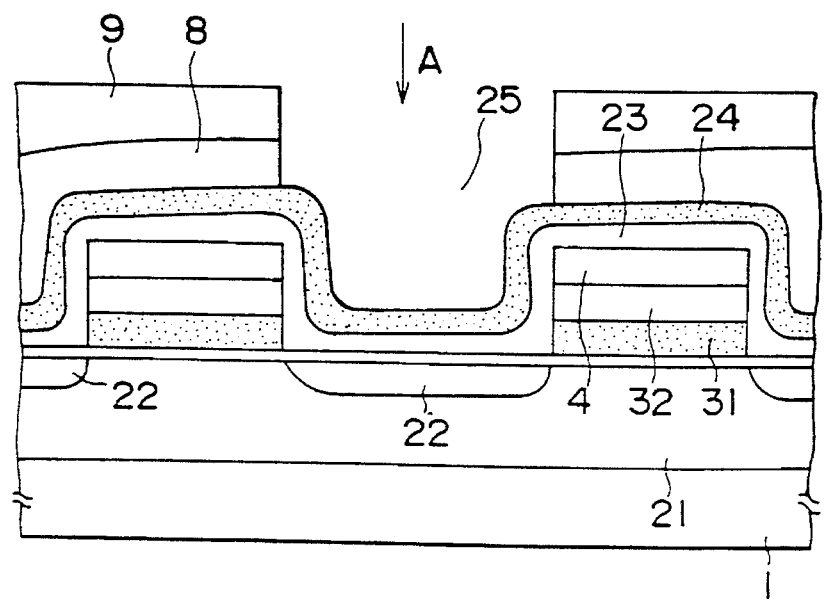
FIG. IB PRIOR ART

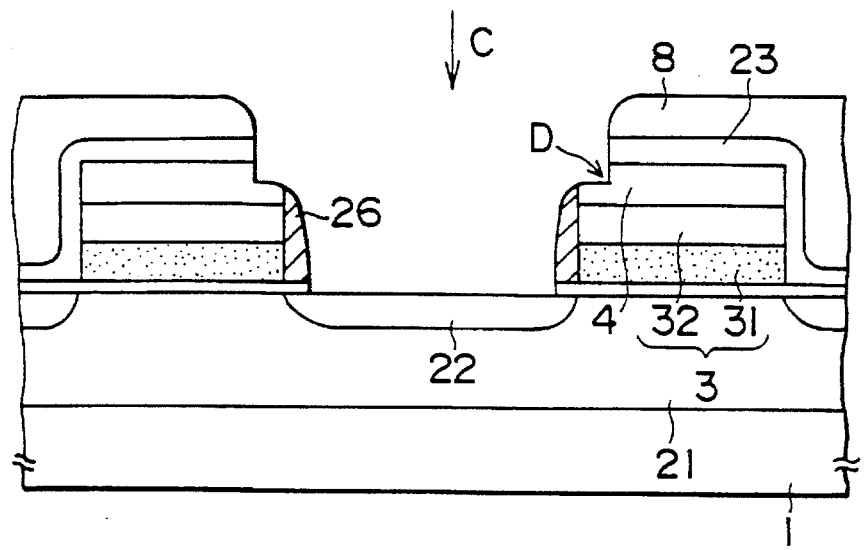
FIG. IE PRIOR ART
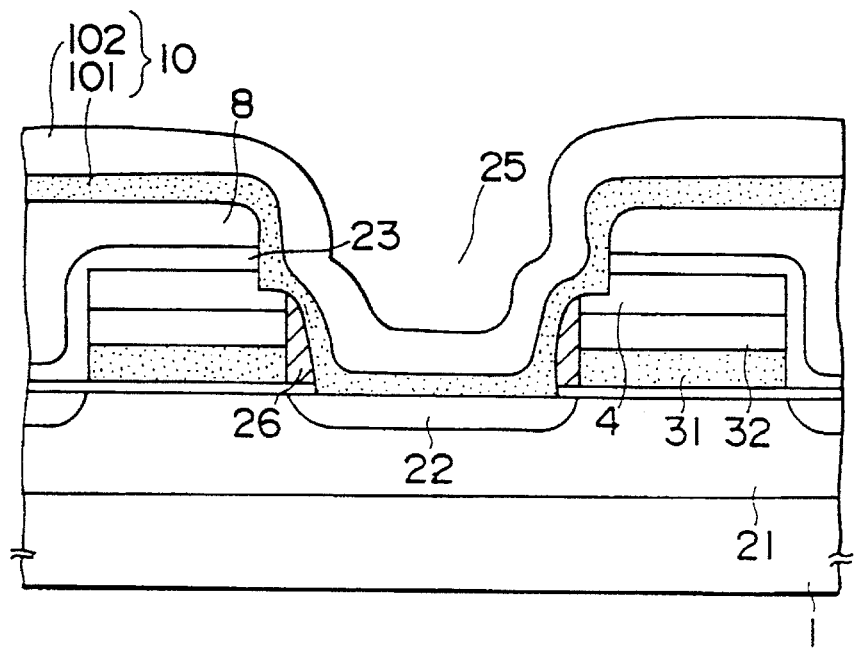
FIG. IF PRIOR ART

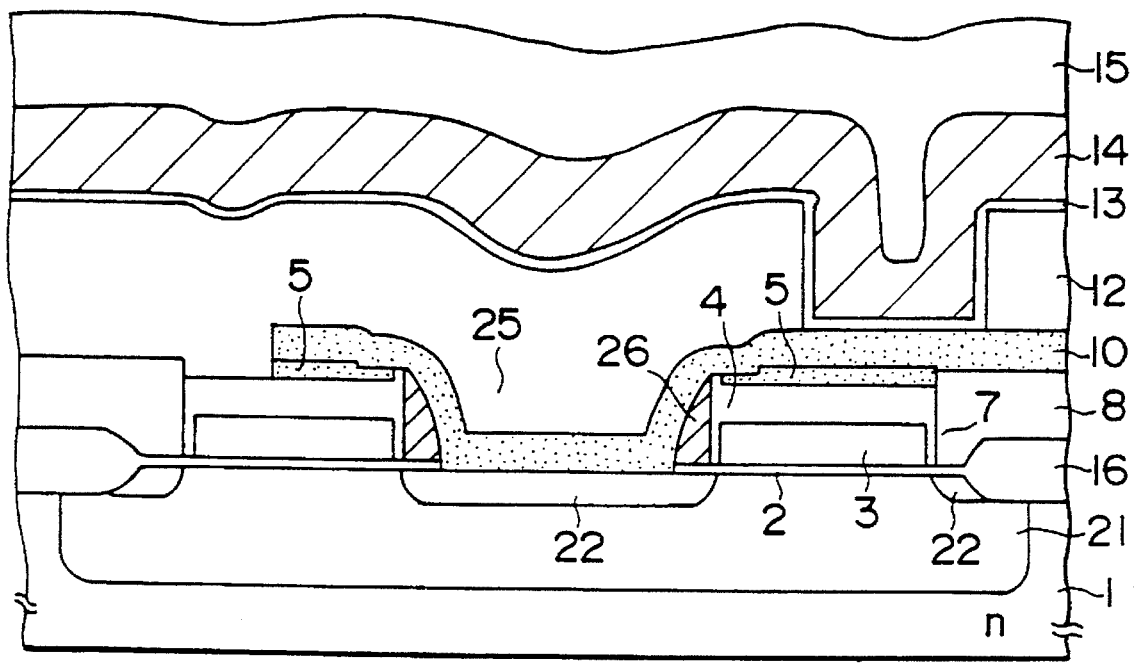
F I G. 2

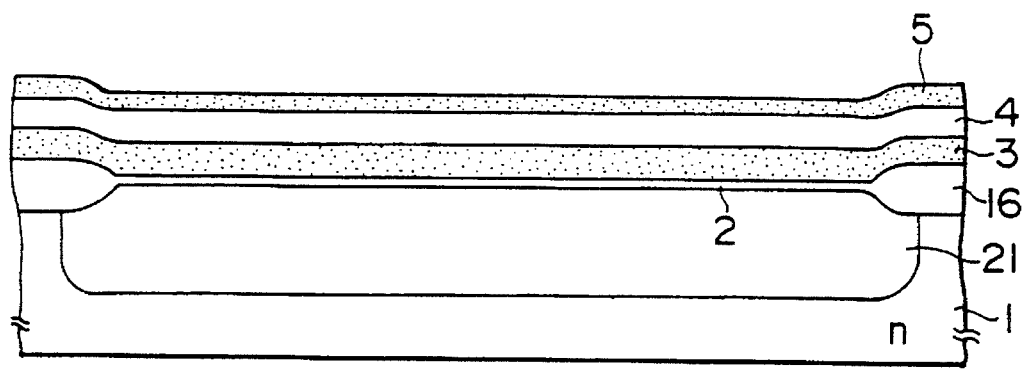
F I G. 3A
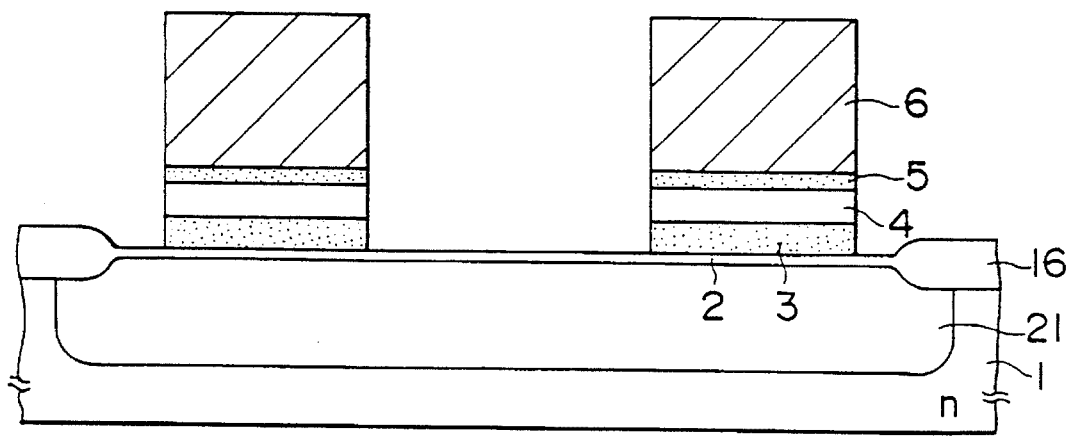
F I G. 3B

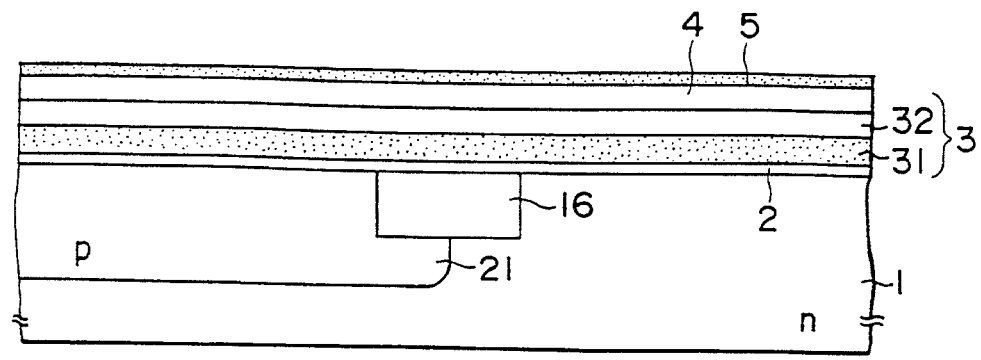
F I G. 5A
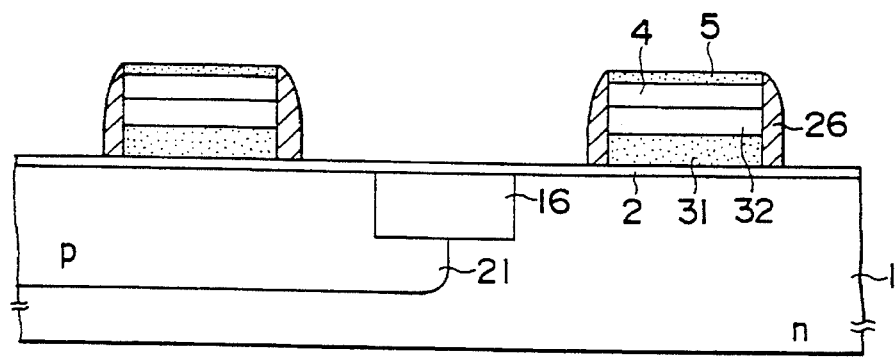
F I G. 5B
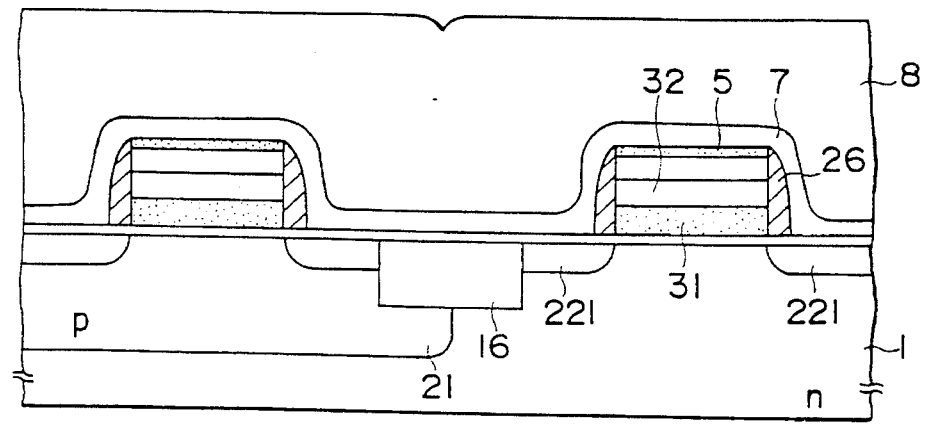
F I G. 5C

SEMICONDUCTOR INTEGRATED CIRCUIT DEVICE WITH WIRING MICROSTRUCTURE FORMED ON GATES AND METHOD OF MANUFACTURING THE SAME

This is a divisional of application Ser. No. 08/149,619, filed on Nov. 9, 1993, now U.S. Pat. No. 5,397,910.

BACKGROUND OF THE INVENTION

1. Field of the Invention

The present invention relates to a semiconductor device of MOS structure, and more specifically to a semiconductor integrated circuit device provided with a wiring microstructure formed on gate electrodes, and a method of manufacturing the same integrated circuit device.

2. Description of the Prior Art

With the advance of higher integration of the semiconductor devices such as ICs or LSIs, higher miniaturization technique has been required more and more. In the semiconductor integrated circuit device of MOS structure widely used as memory devices, in particular, since a plurality of gate electrodes are arranged in a well, the interval distance between the gate electrodes has been narrowed more and more with the advance of the microminiaturization technique. In this case, the wiring for connecting active regions formed in a semiconductor substrate to other regions through the surface of the semiconductor substrate is usually formed in accordance with gate self-alignment contact technique (referred to as gate SAC method or structure, hereinafter), by which contact holes are formed between the gate electrodes. Conventionally, however, when the contact holes are formed in the self-alignment contact structure, in order to prevent the wiring contacting the underlayer semiconductor substrate from being shorted to the gate electrode of the MOS transistor, the upper and side portions of the gate electrode are covered with an insulating film whose etching speed is lower than that of an interlayer insulating film formed on the semiconductor substrate, so that an insulating film with a sufficient film thickness can be retained between the gate electrode and the wiring after the contact has been formed between the gate electrodes.

In this conventional method, however, when the overetching time is prolonged to form the contact holes, since the insulating film is etched away at the upper and side portions of the gate electrodes, the margin is reduced in the manufacturing process. To overcome this problem, that is, to securely leave the insulating film, the other method has been so far proposed such that: the gate electrodes are covered with an insulating film; an insulating film and a poly-crystal silicon film are deposited all over; another insulating film is deposited and then melt for planarization (flattening) process; the insulating film on the poly-crystal silicon film is removed by such an etching method that the etching ratio of the insulating film to the poly-crystal silicon can be selected; and thereafter the poly-crystal silicon is removed. In this manufacturing method, since the interlayer insulating film contacting the semiconductor substrate can be etched so as to be fairly thinner than that of the insulating film covering the gate electrodes, without etching the insulating film covering the gate electrodes, it is possible to secure the insulating film having a sufficient thickness around the gate electrodes, even if overetched to some extent.

The above-mentioned conventional method of manufacturing the semiconductor integrated circuit will be described in further detail with reference to FIGS. 1A to 1F. In this manufacturing process, as shown in FIG. 1A, an element separating region 16 is first formed in an N-type silicon semiconductor substrate 1 in accordance with LOCOS (localized oxidation of silicon) technique. Thereafter, a P well region 21 is formed and then a gate oxide film 2 of $SiO_2$ is formed all over the semiconductor substrate 1 by thermal oxidation, for instance. Further, a gate electrode 3 (31 and 32) of poly-crystal silicon are formed on the gate oxide film 2 and a silicide film of high melting point metal such as Mo or W is deposited on the poly-crystal of the gate electrode to reduce the resistance of the gate electrode 3. A $WSi_2$ film 32 is formed on the poly-crystal silicon film 31. The resistance of the poly-crystal silicon film 31 is reduced by diffusing B or P ions thereinto at high concentration. The gate electrode 3 is covered with an insulating film 4 of $SiO_2$, for instance. Successively, N-type impurities are ion-implanted into the well region 21 of the semiconductor substrate 1 to form an N-type source/drain region 22 on both sides of the gate electrode 3 in the semiconductor substrate 1.

Further, an insulating film 23 of $Si_3N_4$ is formed on the surface of the semiconductor substrate 1 so as to cover the gate electrode 3 and the insulating film 4 which covers the electrode 3. In addition, a poly-crystal silicon film 24 is deposited on the insulating film 23, and then another thick insulating film 8 of BPSG (boron phosphorus silicate glass) is formed on the poly-crystal silicon film 24.

Thereafter, the surface of the BPSG film 8 is melted for planarization. As shown in FIG. 1B, a photoresist 9 is formed on the BPSG film 8 except a predetermined region between the parallel arranged gate electrode 3, and a contact hole 25 is formed by opening the portion at which the BPSG film 8 is exposed in arrow direction A in accordance with anisotropic etching (e.g., RIE (reactive ion etching)), for instance. This contact hole 25 is formed relatively wide to such a degree as to extend to over the gate electrode 3. The etching speed of the planarized BPSG film 8 is about 50 times higher than that of the poly-crystal silicon 24. Therefore, even if the BPSG film 8 is opened almost completely to form the contact hole 25 in the BPSG film 8, the poly-crystal silicon film 24 under the BPSG film 8 remains as it is without being etched.

Further, as shown in FIG. 1C, the poly-crystal silicon film 24 in the contact hole 25 is removed by etching in arrow direction B to expose the insulating film 23. Then, as shown in FIG. 1D, a poly-crystal silicon 24 (for covering the gate electrode 3 and the insulating films 4 and 23) is treated for oxidation at a high temperature of about 800° to 900° C. to change the poly-crystal silicon film 24 to silicon oxide as a part of the BPSG film 8. Further, as shown in FIG. 1E, the insulating film 23 and the gate oxide film 2 in the contact hole 25 are removed by the anisotropic etching (e.g., RIE) in arrow direction C to expose the surface of the semiconductor substrate 1. Further, another insulating film (not shown) is formed all over the surface of the semiconductor substrate 1, this insulating film is removed by the anisotropic etching to form an insulating side wall 26 of the gate electrode 3 in the contact hole 25. In this process, as shown by arrow D in FIG. 1E, the insulating film 4 for covering the gate electrode 3 is slightly etched off. Thereafter, as shown in FIG. 1F, a wipe 10 (101 and 102) connected to the source/drain region 22 in the semiconductor substrate 1 is formed on the contact hole 25 and the planarized BPSG film 8. The wipe 10 is formed of a poly-crystal silicon film. However, the wipe 10 can be formed as a multilayer film composed of the poly-crystal silicon film and the siliside film of a high melting point metal such as $WSi_2$. The resistance of the poly-crystal silicon film is reduced by diffusing B or P ions at high density in accordance with the ion implantation technique.

In the conventional MOS type semiconductor device as described above, the resistance of both the poly-crystal silicon film 31 for constituting the gate electrode and the poly-crystal silicon film 101 (formed as the wire) of the gate SAC structure is reduced by diffusing impurities such as B or P ions at high concentration in accordance with the ion implantation. However, when the wire 10 is arranged over the gate electrode 3, since the ions enter the gate electrode 3 through the wire 10, so that the impurities increase excessively and unnecessarily in the gate electrode 3. Further, when the conductive type of the impurities entering the gate electrode is different from that of the impurities existing in the gate electrode, since the impurity concentration is substantially reduced, it has been difficult to obtain stable gate characteristics.

Further, in the conventional method as described above, since the etching rate of the insulating film 4 for covering the gate electrode 3 is not different so much from the etching rate of the interlayer insulating films 23 and 8 deposited on the insulating film 4, when the contact hole 25 is over-etched during the contact hole opening process, the thicknesses of the insulating films 23 and 8 for covering the gate electrode 3 are reduced, with the result that the wire 10 and the gate electrode 3 are shorted to each other in the worst case. The poly-crystal silicon film 24 is employed as a stopper for preventing the above-mentioned short.

Although etching rate of the poly-crystal silicon film 24 is considerably slower than that of the respective insulating films, since the poly-crystal silicon film 24 is conductive, it is necessary to change the poly-crystal silicon film 24 to the insulating film of silicon oxide film by oxidation treatment.

However, if the above-mentioned oxidation treatment is not sufficient, the following problems arise: in FIGS. 1B to 1E, when the contact hole 25 is being opened, the etching is stopped at the poly-crystal silicon film 24 of slow etching rate, with the result that the contact hole cannot be opened; the semiconductor substrate as the underlayer is not exposed; or even if the contact hole is opened, the contact holes are shorted to each other through the residual poly-crystal silicon film. In addition, the poly-crystal silicon film must be usually heat treated at a high temperature for some hours within an oxidation atmosphere for oxidation. However, since the manufacturing process of the semiconductor device has been treated at lower temperature more and more due to the advance of element microminiaturization, it has become difficult to oxidize the poly-crystal silicon film perfectly, and thereby it is difficult to form the gate self-alignment contact structure.

SUMMARY OF THE INVENTION

With these problems in mind, therefore, it is the object of the present invention to provide a semiconductor integrated circuit device of a stable gate SAC structure, without reducing the thickness of the insulating film for covering the gate electrodes during the contact opening process, and the manufacturing method of the same semiconductor integrated circuit device.

To achieve the above-mentioned object, the present invention provides a semiconductor device, comprising: a semiconductor substrate; a gate oxide film formed on said semiconductor substrate; a gate electrode having a first conductive film formed on said gate oxide film; a first insulating film formed on said gate electrode; a second conductive film formed on said first insulating film; a second insulating film formed on said semiconductor substrate in such a way that said second conductive film can be exposed, a thickness of said second insulating film being roughly equal to a sum total thickness of said gate electrode, said first insulating film and said second conductive film, a surface of said second insulating film being planarized; a contact hole formed in said second insulating film, a part of said contact hole being a part of a side wall of a lamination layer portion composed of said gate electrode, said first insulating film and said second conductive film; and a wire having at least a third conductive layer contacting said second conductive film and arranged on said second insulating film and in said contact hole.

In the above-mentioned semiconductor device, at least two lamination layer portions are formed and said contact hole is formed between the two lamination layer portions. Further, the lamination layer portion is formed with an insulating side wall for insulating said lamination layer portion from said wire or vice versa. Further, the sum total thickness of said second conductive film and the third conductive film contacting said second conductive film is large enough to prevent impurities implanted into said wire from being doped into said gate electrode.

Further, the present invention provides a method of manufacturing a semiconductor device, comprising the steps of: forming a gate oxide film on a semiconductor substrate; forming a first conductive film on the gate oxide film; forming a first insulating film on the first conductive film; forming a second conductive film on the first insulating film; forming a gate electrode having the first conductive film covered with the first insulating film and the second conductive film, by etching the second conductive film, the first insulating film and the first conductive film, respectively; forming a second insulating film on the semiconductor substrate so as to cover the second conductive film; selectively removing a surface of the second insulating film for planarization thereof, until the second conductive film is exposed; forming a contact hole of self-alignment contact structure to expose a surface of the semiconductor substrate, by etching a predetermined region at which the second insulating film is not removed, with the gate electrode as a mask; and forming a wire on the second conductive film and the second insulating film and in the contact hole so as to be brought into contact with the semiconductor substrate.

In the above-mentioned method, an insulating side wall is additionally formed on a side surface of a lamination layer portion composed of the gate electrode, the first insulating film and the second conductive film, to insulate the wire from the lamination layer portion or vice versa. Further, in the step of forming the contact hole to expose the semiconductor substrate, an insulating side wall is formed to insulate the wire from the gate electrode or vice versa, by leaving the second insulating film on a side surface of the contact hole. Further, in the step of forming the second conductive film and the wire on the second conductive film, a sum total thickness of the second conductive film and the wire is determined to be large enough to prevent impurities implanted into the wire from being doped into the gate electrode.

BRIEF DESCRIPTION OF THE DRAWINGS

FIGS. 1A to 1F are cross-sectional views showing the conventional semiconductor device, for assistance in explaining the manufacturing process thereof;

FIG. 2 is a cross-sectional view showing a first embodiment of the semiconductor device according to the present invention;

FIGS. 3A to 3H are cross-sectional views showing the first embodiment of the semiconductor device according to the present invention, for assistance in explaining the manufacturing process thereof;

FIGS. 5A to 5F are cross-sectional views showing the second embodiment of the semiconductor device according to the present invention, for assistance in explaining the manufacturing process thereof.

DETAILED DESCRIPTION OF THE PREFERRED EMBODIMENTS

Figure 1C:
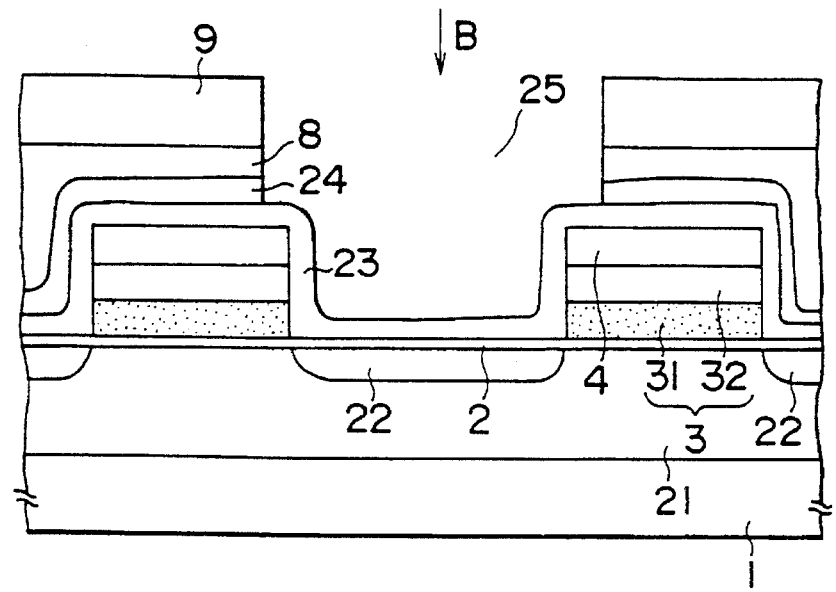
Figure 1D:
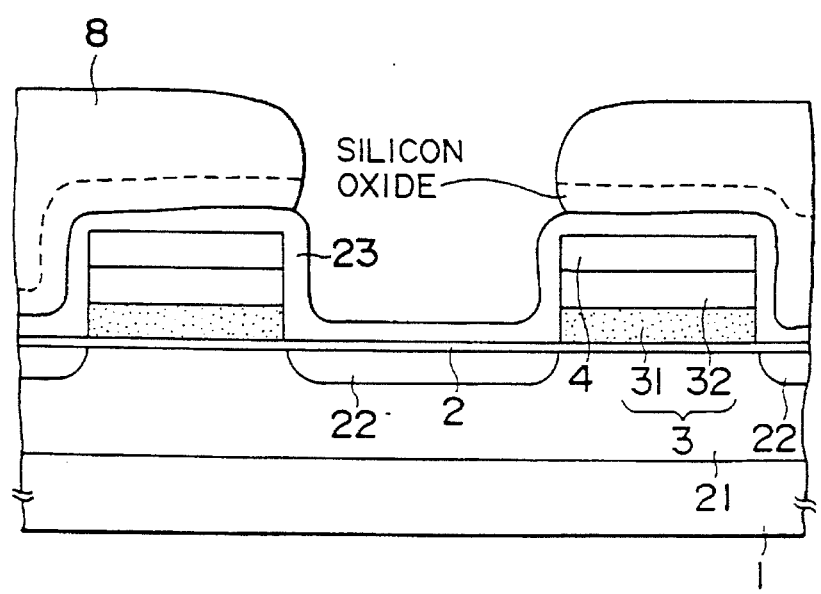

The embodiments of the present invention will be described in detail with reference to the attached drawings, in which the same reference numerals have been retained for similar elements which have the same functions as with the case of the conventional semiconductor device previously described with reference to FIGS. 1A to 1F.

FIG. 2 shows the first embodiment of the present invention, which is a cross-sectional view showing an element formed in a P well of a SRAM (static RAM) related to the present invention. With the advance of the higher integration of the semiconductor device, the distance between gates of a plurality of MOS transistors used for the SRAM, for instance has been decreased more and more. Therefore, contact holes for electrically connecting internal circuits formed in the semiconductor substrate to wires formed on the surface of the semiconductor substrate are usually opened between the gates in accordance with the gate SAC (self-alignment contact) method.

In FIG. 2, an element separating region 16 is formed in an N-type silicon semiconductor substrate 1 in accordance with the LOCOS (localized oxidation of silicon), and a P well 21 is formed in the region 16. Further, an N-type source/drain region 22 of the MOS transistor is formed in the P well 21. On the surface of the semiconductor substrate 1, a gate oxide film 2 is formed except a contact portion in a contact hole 25. On the gate oxide film 2, a poly-crystal silicon gate electrode (a first conductive film) 3 is formed. The resistance of the gate electrode 3 is lowered by implanting impurity ions such as B or P into the poly-crystal silicon. The impurity concentration is adjusted according to the characteristics of the MOS transistor and further diffused when the gate electrode 3 is formed.

On this gate electrode 3, an insulating film (a first insulating film) 4 such as $SiO_2$, for instance is formed. Further, a poly-crystal silicon film (a second conductive film) 5 having a thickness of about 500 to 3000 Å is formed on this insulating film 4. A BPSG (boron phosphorus silicate glass) film (a second insulating film) 8 planarized by etching back is formed except the lamination layer portion (composed of the gate electrode 3, the insulating film 4 and the poly-crystal silicon film (a second conductive film) 5) and the contact hole 25. The thickness of the BPSG film 8 is roughly the same as that of the lamination layer portion (3, 4 and 5). The surface of the lamination layer portion is covered with an insulating film 7 such as $SiO_2$, for instance. Therefore, when the BPSG film 8 is removed, it is possible to form the contact hole 25 between the gate electrodes. An insulating side wall 26 is formed on the inner side surface of the contact hole 25. On the other hand, a wire (a third conductive film) 10 of poly-crystal silicon is formed on the poly-crystal silicon film 8 (formed on the gate electrode 3) and the BPSG film 8 and further extending into the contact hole 25, so as to be connected to the source/drain region 22. The resistance of the poly-crystal silicon of the wire 10 is lowered by doping (e.g., implantation of P ions). Further, an interlayer insulating film 12 of BPSG film is formed so as to cover the wire 10 and the insulating film 8.

When another contact hole is formed in this interlayer insulating film 12, the poly-crystal silicon film of the wire 10 is exposed. Further, a metallic wire 14 is formed on this contact hole and the interlayer insulating film 12 so as to be brought into electric contact with the poly-crystal silicon film of the wire 10. The metallic wire 14 is formed of aluminum alloy containing Si or Cu. Further, a lamination underlayer metallic wire film 13 such as Ti/TiN is formed between the metallic wire 14 and the wire 10 as a barrier metal. An insulating protective (passivation) film 15 formed of PSG (phosphorus-silicate glass) is formed so as to cover the metallic wire 14. Although a part of the surface of the poly-crystal silicon film 5 on the insulating film 4 formed on the gate electrode 3 is thinned by the etching treatment during the manufacturing process, the thickness thereof is about 500 to 3000 Å. Further, since the poly-crystal silicon film 5 and the poly-crystal silicon film of the wire 10 formed thereon are both formed of the same material, the substantial film thickness of the wire 10 is about 500 to 3000 Å on the gate electrode 3. Accordingly, when the impurities are doped into the poly-crystal silicon film of the wire 10, since the doped impurities will not reach the gate electrode 3 owing to the presence of the insulating film 4 and the poly-crystal silicon film 5, the transistor characteristics will not be deteriorated (e.g., change in the threshold voltage of the MOS transistor) by the mixture of the impurities. In addition, the impurities of the gate electrodes 3 and the impurities of the wire 10 are not subjected to the mutual influence between the two, irrespective of the conductivity type (the same or different conductivity types) of the impurities. In other words, it is possible to determine the conductivity type of the impurities of the wire 10 freely, without any consideration of the conductivity type of the impurities doped into the gate electrode 3.

Figure 3C:
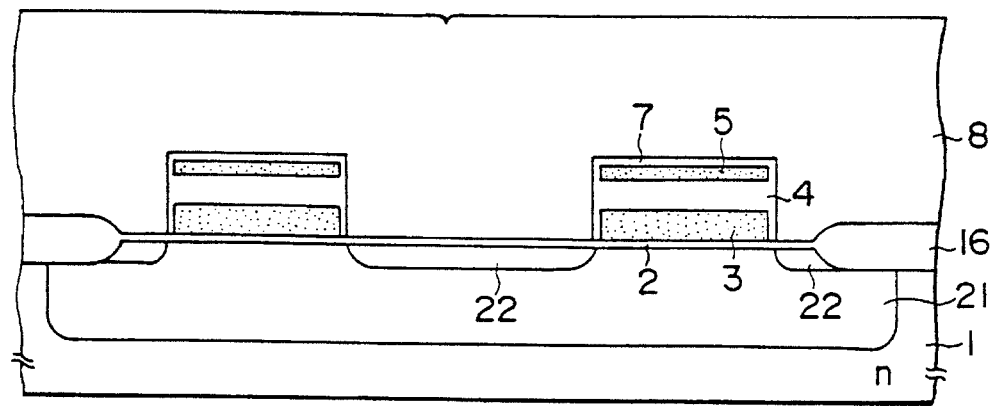

The method of manufacturing the first embodiment of the semiconductor integrated circuit device according to the present invention will be described hereinbelow with reference to FIGS. 3A to 3H. These drawings are the cross-sectional views for assistance in explaining the manufacturing process of the semiconductor device. As shown in FIG. 3A, after the element separating region 16 has been formed in the N-type silicon semiconductor substrate 1 with an electric resistivity of about 1 to 10 Ωcm, the P well region 21 with an impurity concentration of about $1 \times 10^{15}$ to $1 \times 10^{17}$ $cm^{-3}$ is formed in accordance with photo-lithography and ion implantation technique. However, the element separating region 16 can be formed in accordance with the LOCOS method, or alternatively with another element separating method such that a trench is first formed in the semiconductor substrate 1 and then an insulating substance is buried therein. Further, the P well region 21 can be formed before the element separating region 16 is formed. Successively, the gate oxide film 2 with a thickness of 50 to 200 Å is formed; channel ions required to adjust the threshold voltage of the MOS transistor to any desired value is implanted in accordance with the photo-lithography and ion implantation; and a poly-crystal silicon film 3 (gate electrode) is deposited so as to have a thickness of about 1000 to 4000 Å. Further, impurities are doped into the poly-crystal silicon film 3 so as to have a concentration of about $1\times10^{19}$ to $5\times10^{21}$ cm$^{-3}$ in accordance with the photo-lithography and ion implantation or else through an annealing treatment within a phosphorous atmosphere.

In the above-mentioned embodiment, the gate electrode 3 is formed of poly-crystal silicon, however, it is also preferable to reduce the resistance thereof by depositing a siliside film of high melting point metal (e.g., Mo, W, Ti, etc.) on the gate electrode 3. Successively, an insulating film 4 containing oxygen or nitrogen is deposited thereon so as to have a thickness of about 500 to 3000 Å, and further a poly-crystal silicon film 5 is deposited thereon to such an extent of about 500 to 3000 Å in thickness. These films can be deposited in accordance with CVD (chemical vapor deposition) technique under the normal or lower pressure or with sputtering technique.

Further, as shown in FIG. 3B, a photoresist 6 is formed on the poly-crystal silicon film 5, and then patterned. Thereafter, the poly-crystal silicon film 5, the insulating film 4 and the poly-crystal silicon film 3 are all etched in accordance with the photo-lithography and anisotropic etching so as to form the gate electrode. Thereafter, as shown in FIG. 3C, the photoresist 6 is removed, and then heat treated at 800° to 900° C. for about 10 to 60 min within an oxygen atmosphere as occasion demands, so that the surfaces of the gate electrode 3, the insulating film 4 and the poly-crystal silicon film 5 can be all covered with an insulating film 7. Successively, for formation of a source/drain region of the MOS transistor, As ions are implanted at an acceleration voltage of 30 to 80 Kev and a dose of $1\times10^{16}$ cm$^{-2}$ in accordance with the photo-lithography and ion implantation.

Further, although not shown, before or after this ion implantation, it is also possible to deposit an insulating film with a thickness of about 500 to 2000 Å and further etch all over the surface thereof in accordance with the anisotropic etching (e.g., RIE (reactive ion etching)), so that an insulating side wall film can be formed on the side portion of the gate electrode. Successively, the substrate is annealed for impurity activation at 800° to 900° C. for about 10 to 30 min within a nitrogen atmosphere to form the source/drain region 22 in the surface region of the semiconductor substrate 1, and then an insulating film 8 is deposited thereon to a thickness of about 3000 to 12000 Å. In this process, it is preferable to adopt LP CVD (low-pressure CVD) because of its excellent step coverage. In this case, the insulating film is a silicon oxide film or a nitride film or another silicon oxide film containing impurities (e.g., B or P) of about $1\times10^{20}$ to $5\times10^{21}$ cm$^{-3}$ or a lamination layer film formed by these films in combination.

Figure 3D:
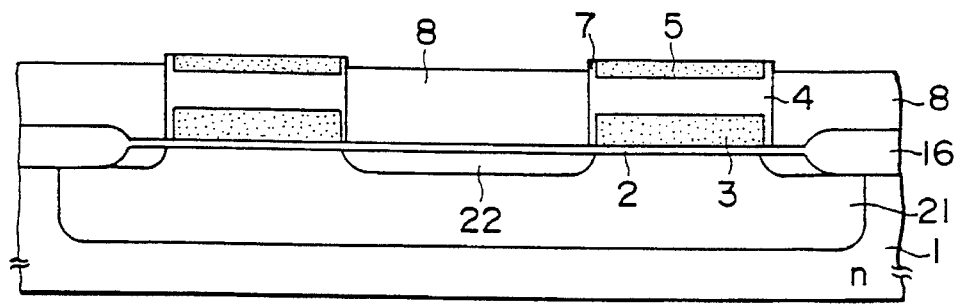

Further, as shown in FIG. 3D, the insulating film 8 is etched back until the poly-crystal silicon film 5 can be exposed by such an etching method that the etching speed is high for the deposited insulating film 8 but low for the poly-crystal silicon film 5. As this etching back, the plasma gas etching method (referred to as RIE) or mechanical and chemical polishing method using an abrasive material (referred to as polish) is preferably adopted. In any methods, the insulating film 8 is etched for planarization with the use of the poly-crystal silicon film 5 as an etching stopper. When etched by the RIE, for instance, if the slow etching speed for the poly-crystal silicon film 5 is 1, the insulating films 8 (BPSG, Si$_3$N$_4$, CVD SiO$_2$) is etched at a high etching speed of about 20 to 50.

Figure 3E:
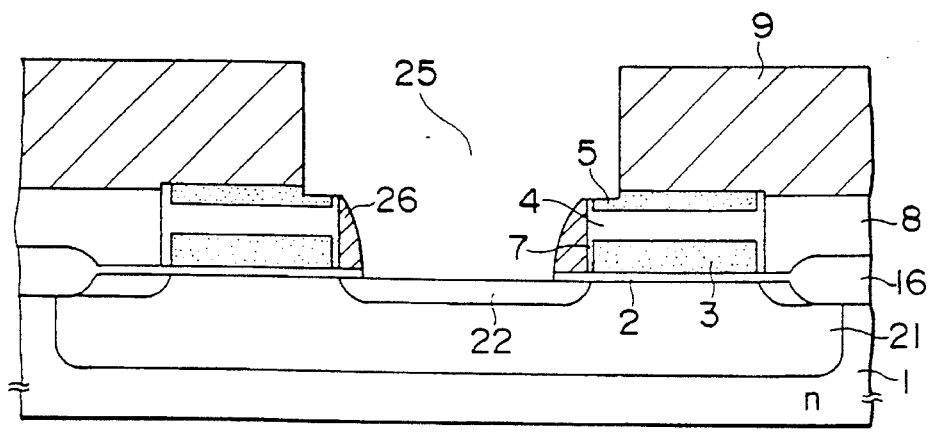

Successively, as shown in FIG. 3E, a photoresist 9 is formed by patterning a contact hole between the two gate electrodes 3 in accordance with the photo-lithography. In this process, since the contact hole is of gate SAC (self-alignment contact) structure, the contact hole 25 is to be formed into such a shape as to bridge over between the two gate electrodes 3. Then, the contact hole 5 is formed by an anisotropic etching method whose etching speed is slow for the poly-crystal silicon film 5. In the anisotropic etching, since the poly-crystal silicon film 5 is hardly etched and further the insulating film 8 is not etched in the traversal direction (horizontal direction in FIG. 3E), a side wall 26 can be formed on the side portion of the gate electrode 3 by the remaining insulating film 8. Owing to the presence of this automatically formed side wall 26, the gate electrode 3 can be insulated from a poly-crystal silicon film of the wire 10 (deposited in the succeeding step). Although the electric insulation by the side wall 26 is important to realize the gate SAC structure, since this side wall can be obtained eventually when the contact hole is formed, it is possible to eliminate this step of forming the side wall for reduction of the number of steps.

Figure 3F:
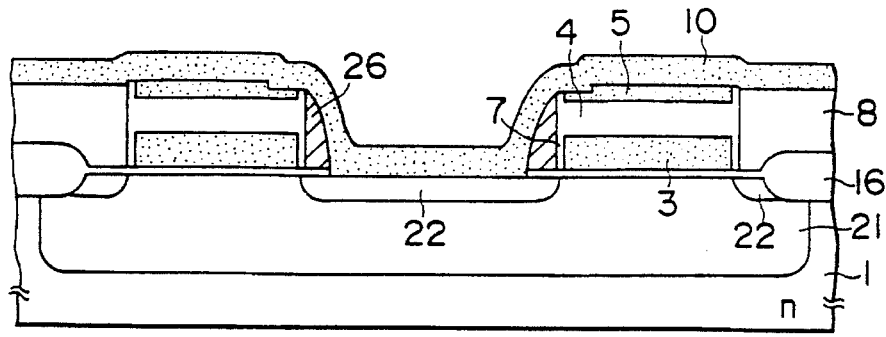

Then, after the photoresist 9 has been removed, a poly-crystal silicon film of the wire 10 is deposited. Further, as shown in FIG. 3F, P ions are implanted into the poly-crystal silicon film of the wire 10 at an acceleration voltage of 30 to 60 Kev and a dose of $1\times10^{15}$ to $1\times10^{16}$ cm$^{-2}$ in accordance with the photo-lithography and ion implantation. After the photoresist 9 has been removed, it is also possible to deposit a siliside film of a high melting point metal such as Mo, W or Ti to reduce the resistance thereof.

Figure 3G:
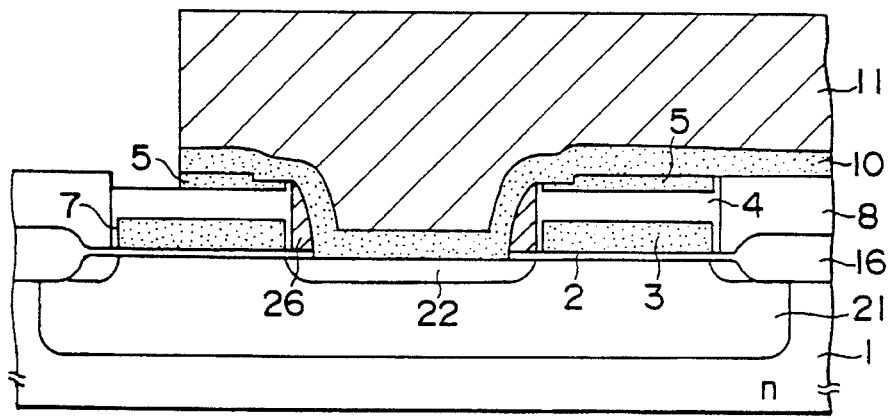

Further, as shown in FIG. 3G, a photoresist 11 is formed and then the poly-crystal silicon film of the wire 10 is patterned in accordance with the photo-lithography and anisotropic etching. In this process, the poly-crystal silicon film 5 used as the etching stopper is all removed except the portion under the poly-crystal silicon film of the wire 10. In the conventional manufacturing method, the poly-crystal silicon film 5 remains sometimes at portions other than those under the poly-crystal silicon film of the wire 10, with the result that the contacts are shored to each other. To overcome this problem, the poly-crystal silicon film 5 has been so far oxidized into a silicon oxide (as an insulating film) through oxidization at high temperature within an oxygen atmosphere. In the present invention, however, since such an oxidization process can be eliminated and thereby the heat treatment time can be shortened, it is possible to manufacture the MOS transistor more advantageously. Then, after the photoresist 11 has been removed, the device is heat treated at 800° to 900° C. for about 10 to 30 min within an oxygen or nitrogen atmosphere.

Figure 3H:
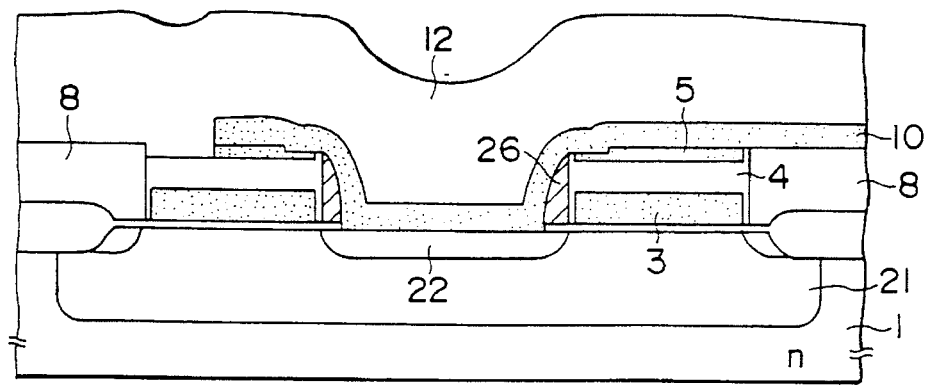

Thereafter, as shown in FIG. 3H, an interlayer insulating film 12 is deposited on the semiconductor substrate 1 to cover the poly-crystal silicon film 10 used as the wire. In this case, the interlayer insulating film 12 is a silicon oxide film or a nitride film or another silicon oxide film containing impurities (e.g., B or P) of about $1\times10^{20}$ to $5\times10^{21}$ cm$^{-3}$ or a lamination layer film composed of these films in combination.

Further, as shown in FIG. 2 (the cross-sectional view of the element), a contact hole 25 is opened in the interlayer insulating film 12 in accordance with the photo-lithography and anisotropic etching. In addition, an underlayer metallic wiring film 13 of Ti or TiN and a metallic wire 14 of Al-Si-Cu (formed on the underlayer metallic wiring film 13) are deposited on the interlayer insulating film 12 and the wire 10 in the contact hole 25 in accordance with the sputtering. The device is further patterned in accordance with the photo-lithography and anisotropic etching and then heat treated at about 300° to 500° C. for about 10 to 60 min within an inert gas atmosphere containing hydrogen. Thereafter, an insulation protective (passivation) film 15 (formed of phosphoric silicic acid or silicon nitride film or a lamination layer of these films) is deposited thereon.

In the above-mentioned description, although the present invention has been explained by taking the case of an NMOS integrated circuit, it is also possible to apply the present invention to PMOS integrated circuits whose conductivity type of the impurities is reversed, respectively; CMOS integrated circuits including both conductivity types; or other integrated circuits including MOS transistors.

The second embodiment of the present invention will be described hereinbelow with reference to FIG. 4, which is a cross-sectional view showing the device. The first embodiment is related to the wiring structure formed in the gate SAC structure arranged between the two gate electrodes of the two MOS transistors formed in one element region. In this second embodiment relates to the wiring structure formed in the gate SAC structure of the CMOS integrated circuit.

Figure 4:
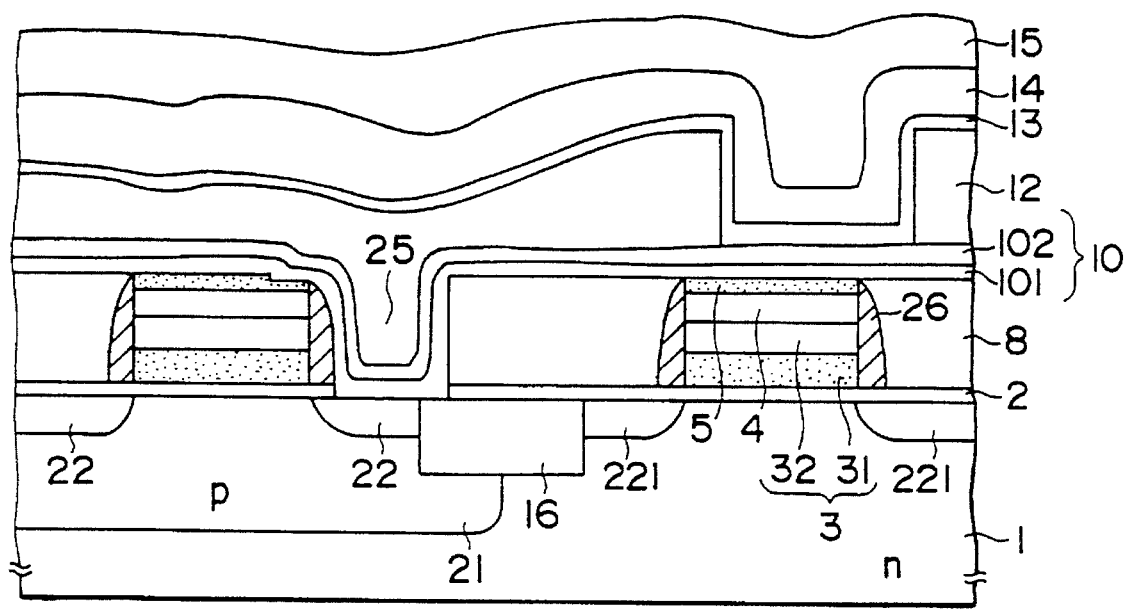
FIG. 4 is a cross-sectional view showing a second embodiment of the semiconductor device according to the present invention.

In FIG. 4, an element separating region 16 is formed in an N-type silicon semiconductor substrate 1 in accordance with the LOCOS (localized oxidation of silicon), and further a P well 21 is formed in the substrate 1. Further, an N-type source/drain region 22 of the MOS transistor is formed in the P well 21, and a P-type source/drain region 221 is formed in the N-type substrate 1. On the surface of the semiconductor substrate 1, a gate oxide film 2 is formed except a contact portion in a contact hole 25 (described later). On the gate oxide film 2, a poly-crystal silicon gate electrode 3 is formed. The resistance of the gate electrode 3 is lowered by implanting impurity ions such as B or P into the poly-crystal silicon. The impurity concentration is adjusted according to the characteristics of the MOS transistor and further diffused when the gate electrode 3 is formed.

On this gate electrode 3, an insulating film 4 such as $SiO_2$, for instance is formed. Further, a poly-crystal silicon film 5 having a thickness of about 1000 Å is formed on this insulating film 4. A BPSG (boron phosphorus silicate glass) film 8 planarized by etching back is formed except the lamination layer portion (composed of the gate electrode 3, the insulating film 4 and the poly-crystal silicon film 5) and the contact hole 25. The thickness of the BPSG film 8 is roughly the same as that of the lamination layer portion (3, 4 and 5). Therefore, after the BPSG film 8 is removed, the contact hole 25 can be formed between the gate electrodes and in the vicinity of the gate electrode on the P well 21. An insulating side wall 26 is formed on both the inner side surfaces of the gate electrode 3, the insulating film 4 and the poly-crystal silicon film 5. The wire 10 of poly-crystal silicon is formed on the poly-crystal silicon film 5 (formed on the gate electrode 3) and the BPSG film 8 and further extending into the contact hole 25, so as to be connected to the source/drain region 22 formed under the contact hole 25. The resistance of the poly-crystal silicon of the wire 10 is lowered by doping (e.g., implantation of P ions). Further, an interlayer insulating film 12 of BPSG film is formed so as to cover the wire 10 and the insulating film 8.

When another contact hole is formed in this interlayer insulating film 12, the poly-crystal silicon film of the wire 10 is exposed. Further, a metallic wire 14 is formed on this contact hole and the interlayer insulating film 12 so as to be brought into electric contact with the poly-crystal silicon film of the wire 10. The metallic wire 14 is formed of aluminum alloy containing Si or Cu. Further, a lamination underlayer metallic wire film 13 such as Ti/TiN is formed between the metallic wire 14 and the wire 10 as a barrier metal. An insulating protective (passivation) film 15 formed of PSG (phosphorus-silicate glass) is formed so as to cover the metallic wire 14. Although a part of the surface of the poly-crystal silicon film 5 on the insulating film 4 formed on the gate electrode 3 is thinned on the P well region 21 by the etching treatment during the manufacturing process, the thickness thereof is about 1000 Å. Further, since the poly-crystal silicon film 5 and the poly-crystal silicon film of the wire 10 formed thereon are both formed of the same material, the substantial film thickness of the wire 10 is about 1000 Å on the gate electrode 3. Accordingly, when the impurities are doped into the poly-crystal silicon film of the wire 10, since the doped impurities will not reach the gate electrode 3 owing to the presence of the insulating film 4 and the poly-crystal silicon film 5, the transistor characteristics will not be deteriorated (e.g., change in the threshold voltage of the MOS transistor) by the mixture of the impurities. In addition, the impurities of the gate electrodes 3 and the impurities of the wire 10 are not subjected to the mutual influence between the two, irrespective of the conductivity type (the same or different conductivity types) of the impurities. In other words, it is possible to determine the conductivity type of the impurities of the wire 10 freely, without any consideration of the conductivity type of the impurities doped into the gate electrode 3.

Figure 5D:
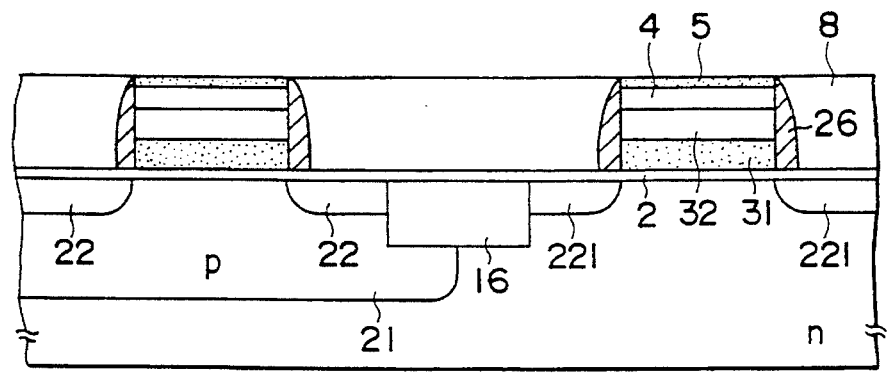

The method of manufacturing the second embodiment of the semiconductor integrated circuit device according to the present invention will be described hereinbelow with reference to FIGS. 5A to 5F. These drawings are the cross-sectional views for assistance in explaining the manufacturing process of the semiconductor device. As shown in FIG. 5A, after the element separating region 16 of buried structure has been formed in the N-type silicon semiconductor substrate 1 with an electric resistivity of about 1 to 10 Ωcm, the P well region 21 is formed in accordance with photo-lithography and ion implantation technique. Further, the gate oxide film 2 with a thickness of about 50 to 200 Å is formed by thermal oxidation. Further, a poly-crystal silicon film 31 with a thickness of about 2000 Å is deposited on the gate oxide film 2. Impurity ions such as P are implanted and diffused into the poly-crystal silicon film 31. Instead of the poly-crystal silicon, it is also possible to use amorphous silicon. Thereafter, a $WSi_2$ film 32 with a thickness of about 1000 Å is deposited on the poly-crystal silicon film 31, further the insulating film with a thickness of about 2000 Å is formed thereon, and further the poly-crystal silicon film 5 with a thickness of about 1000 Å is deposited thereon. The gate electrode 3 is composed of the poly-crystal silicon film 31 and the $WSi_2$ film 32. Instead of the poly-crystal silicon film 5, amorphous silicon can be used. These films are formed in accordance with CVD or sputtering.

Successively, as shown in FIG. 5B, the above-mentioned lamination layer portion is patterned in accordance with the photo-lithography and anisotropic etching, to form the gate electrode 3 (composed of two films 31 and 32), the $SiO_2$ film 4 (which is formed on the gate electrode 3), and the poly-crystal silicon film 5 (which serves as a stopper) on the P well 21 and the semiconductor substrate 1. Further, a nitride silicon ($Si_3N_4$) film (not shown) is formed so as to cover the lamination layer portion of the gate electrode 3, the insulating film 4 and the poly-crystal silicon film 5. Further, the insulating side wall 26 formed of nitride silicon is formed on this lamination layer portion by etching this nitride silicon film by the anisotropic etching (e.g., RIE).

Further, as shown in FIG. 5C, the source/drain region of the MOS transistor is formed. That is, the N-type source/ drain region 22 is formed by implanting As ions, for instance into the P well 21, and the P-type source/drain region 221 is formed by implanting B ions, for instance into the semiconductor substrate 1. Thereafter, the surface of the semiconductor substrate including the lamination layer portion is covered with an insulating film 7 of $SiO_2$, and further the thick BPSG film 8 is formed.

Further, as shown in FIG. 5D, the BPSG film 8 is etched back until the poly-crystal silicon film 5 can be exposed by such an etching method (e.g., RIE) that the etching speed is high for the deposited BPSG film 8 but low for the poly-crystal silicon film 5, so that the surface of the BPSG film 8 can be planarized. As this etching back, the poly-crystal silicon film 5 is uses as an etching stopper.

Figure 5E:
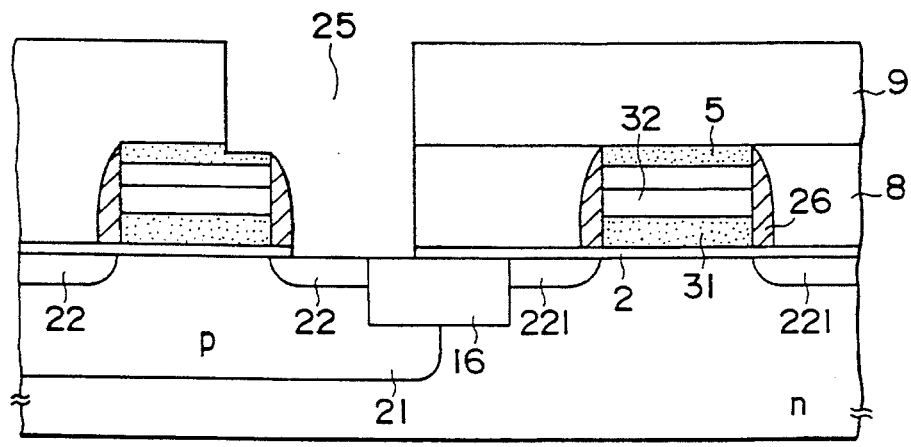

Successively, as shown in FIG. 5E, a patterned photoresist 9 is formed on the planarized BPSG film 8, and a contact hole of gate SAC structure is formed by the anisotropic etching such as RIE. The formed contact hole 25 of gate SAC structure is formed on the P well 21 and in the vicinity of the gate electrode so as to extend to over the gate electrode. In this process, since the contact hole is hardly etched in the same way as with the case of the first embodiment, the insulating side wall 26 remains as it is in the contact hole 25.

Figure 5F:
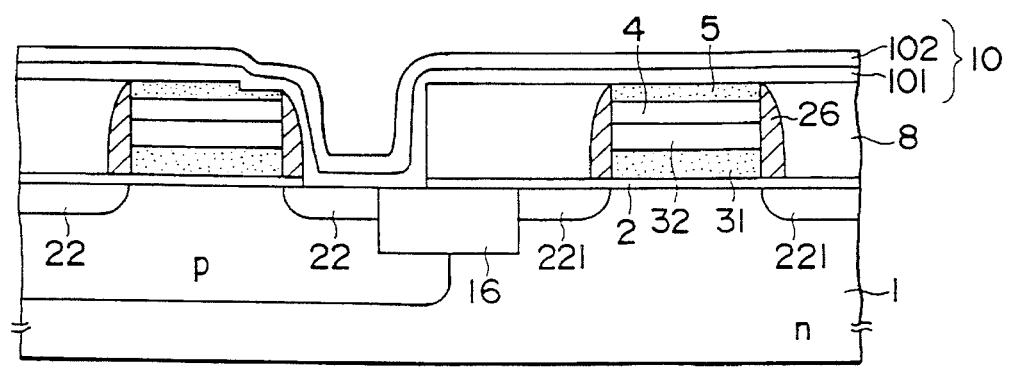

Further, as shown in FIG. 5F, a poly-crystal silicon film 101 is deposited on the planarized BPSG film 8 and the contact hole 25 so as to be brought into electric contact with the source/drain region 22. The resistance of the poly-crystal silicon film 101 is also adjusted by implanting impurities such as P ions thereinto. In addition, a $WSi_2$ film 102 is deposited on the poly-crystal silicon 101. The poly-crystal silicon film 101 and the $WSi_2$ film 102 constitute the wire 10.

Further, with reference to FIG. 4 (the cross-sectional view of the element), an interlayer insulating film 12 of CVD $SiO_2$ is formed on the semiconductor substrate 1 so as to cover the wire 10, and further another contact hole is formed in this interlayer insulating film 12. Further, the underlayer metallic wiring film 13 of TiN and the metallic wire of Al-Si-Cu alloy are formed so as to be brought into electric contact with the metallic wire 10. Further, the metallic wire 14 is protected by a passivation film 15 of PSG.

As described above, in the second embodiment, the poly-crystal silicon film 5 is provided with such effects as to increase the film thickness of the wire 10 (including the poly-crystal silicon film 101 arranged over the gate electrode 3) over the gate electrode, and further to serve as an etching stopper effective when the contact hole is being formed.

In the semiconductor device according to the present invention, the concentration of impurities diffused into the gate electrode can be regulated correctly, and further the gate SAC structure for forming contacts between two closely arranged gate electrodes can be realized in the simple process, as compared with the conventional process, without heat treatment for the gate SAC structure. Further, since the underlayer is planarized, the process margin of the photolithography and etching required for forming the wire on the gate electrode via the insulating film can be widened, because the underlayer thereof is planarized.

In the above-mentioned embodiments, the manufacturing technique such as LOCOS, the composition or thickness of each of the respective films, the treating time such as heat treatment are described only by way of examples, so that the present invention is not limited to only the embodiments described herein above.

What is claimed is:

1. A method of manufacturing a semiconductor device, comprising the steps of:

forming a gate oxide film on a semiconductor substrate;

forming a first conductive film on the gate oxide film;

forming a first insulating film on the first conductive film;

forming a second conductive film on the first insulating film;

forming a gate electrode, which includes the first conductive film, by etching the second conductive film, the first insulating film and the first conductive film;

forming a second insulating film over the semiconductor substrate so as to cover the second conductive film;

selectively removing a portion of the second insulating film for planarization thereof, until the second conductive film is exposed;

forming a contact hole of self-alignment contact structure to expose a surface of the semiconductor substrate, by etching a surface of the semiconductor device except the exposed second conductive film, with the gate electrode as a mask; and forming a wire on the second conductive film and the second insulating film and in the contact hole so as to be brought into contact with the semiconductor substrate.

2. The method of manufacturing a semiconductor device of claim 1, which further comprises a step of forming an insulating side wall on a side surface of a lamination layer composed of the gate electrode, the first insulating film and the second conductive film, to insulate the wire from the lamination layer or to insulate the lamination layer from the wire.

3. The method of manufacturing a semiconductor device of claim 1, wherein in the step of forming the contact hole to expose the semiconductor substrate, an insulating side wall is formed to insulate the wire from the gate electrode or to insulate the gate electrode from the wire, by leaving the second insulating film on a side surface of the contact hole.

4. The method of manufacturing a semiconductor device of claim 1, in the step of forming the second conductive film and the wire on the second conductive film, a sum total thickness of the second conductive film and the wire is determined to be large enough to prevent impurities implanted into the wire from being doped into the gate electrode.

* * * * *